US012745552B2

(12) United States Patent
Dong

(10) Patent No.: US 12,745,552 B2
(45) Date of Patent: Sep. 22, 2026

(54) MOTHERBOARD AND FORMING METHOD OF DISPLAY BASE UNITS

(71) Applicant: Hubei Yangtze Industrial Innovation Center of Advanced Display Co., LTD., Wuhan (CN)

(72) Inventor: Bo Dong, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 384 days.

(21) Appl. No.: 18/406,956

(22) Filed: Jan. 8, 2024

(65) Prior Publication Data

US 2024/0431187 A1 Dec. 26, 2024

(30) Foreign Application Priority Data

Jun. 25, 2023 (CN) ........................ 202310755695.3

(51) Int. Cl.
*H10K 59/88* (2023.01)
*H10K 71/00* (2023.01)

(52) U.S. Cl.
CPC ........... *H10K 59/88* (2023.02); *H10K 71/851* (2023.02)

(58) Field of Classification Search
CPC .... H10K 59/131; H10K 59/88; H10K 71/851; H10K 71/00
USPC ........................................................ 361/748
See application file for complete search history.

(56) References Cited

U.S. PATENT DOCUMENTS

2023/0363228 A1* 11/2023 Jia ........................ H10K 59/131

FOREIGN PATENT DOCUMENTS

CN 109461384 A * 3/2019 ............... G09F 9/30
CN 109461384 B 3/2021

* cited by examiner

*Primary Examiner* — Timothy J Thompson
*Assistant Examiner* — Guillermo J Egoavil
(74) *Attorney, Agent, or Firm* — Anova Law Group, PLLC

(57) ABSTRACT

Motherboard and method of forming display base units are provided. The motherboard has a first area and a second area surrounding the first area. The motherboard includes a substrate; a plurality of display base units arranged at intervals on the substrate in the first area; and a protection line on the substrate. The protection line includes an outer line in the second area around an outer periphery of the first area, and an inner line in the first area.

17 Claims, 11 Drawing Sheets

MOTHERBOARD AND FORMING METHOD OF DISPLAY BASE UNITS

CROSS-REFERENCE TO RELATED APPLICATION

This application claims priority of Chinese Patent Application No. 202310755695.3, filed on Jun. 25, 2023, the entire contents of which are hereby incorporated by reference.

FIELD OF THE DISCLOSURE

The present disclosure generally relates to the field of display technology and, more particularly, relates to a motherboard and a method of forming display base units.

BACKGROUND

Organic light emitting diode (OLED) display panel has many advantages including full solid state, active light emission, fast response speed, high contrast, no viewing angle limitation, and flexible display. The OLED technology is a new type of display technology developed in the middle of the 20th century and is widely used. Vapor deposition technology is a process method commonly used in forming organic thin films for OLED display panels. The vapor deposition technology has advantages of fast deposition speed and good film formation uniformity. However, a static electricity protection capability of a motherboard in the related art is poor, and a static electricity generated during a vapor deposition process is easy to damage circuits on the motherboard, thereby reducing product forming yield.

BRIEF SUMMARY OF THE DISCLOSURE

One aspect of the present disclosure provides a motherboard. The motherboard has a first area and a second area surrounding the first area. The motherboard includes a substrate; a plurality of display base units arranged at intervals on the substrate in the first area; and a protection line on the substrate. The protection line includes an outer line in the second area around an outer periphery of the first area, and an inner line in the first area.

Another aspect of the present disclosure provides a forming method of display base units. The forming method includes providing a substrate, the substrate having a first area and a second area surrounding the first area; forming a protection line on the substrate, the protection line including an outer line and an inner line, the outer line being in the second area and being arranged around an outer periphery of the first area, and the inner line being in the first area; forming initial display units in the first area of the substrate; and cutting the substrate to form display base units.

Other aspects of the present disclosure can be understood by a person skilled in the art in light of the description, the claims, and the drawings of the present disclosure.

BRIEF DESCRIPTION OF THE DRAWINGS

To illustrate technical solutions more clearly in exemplary embodiments of the present disclosure, accompanying drawings that need to be used in descriptions of the exemplary embodiments will be briefly introduced below. Obviously, the accompanying drawings described below are merely some embodiments of the present disclosure. A person skilled in the art can obtain other accompanying drawings according to the accompanying drawings without creative efforts.

DETAILED DESCRIPTION

Figure 1:
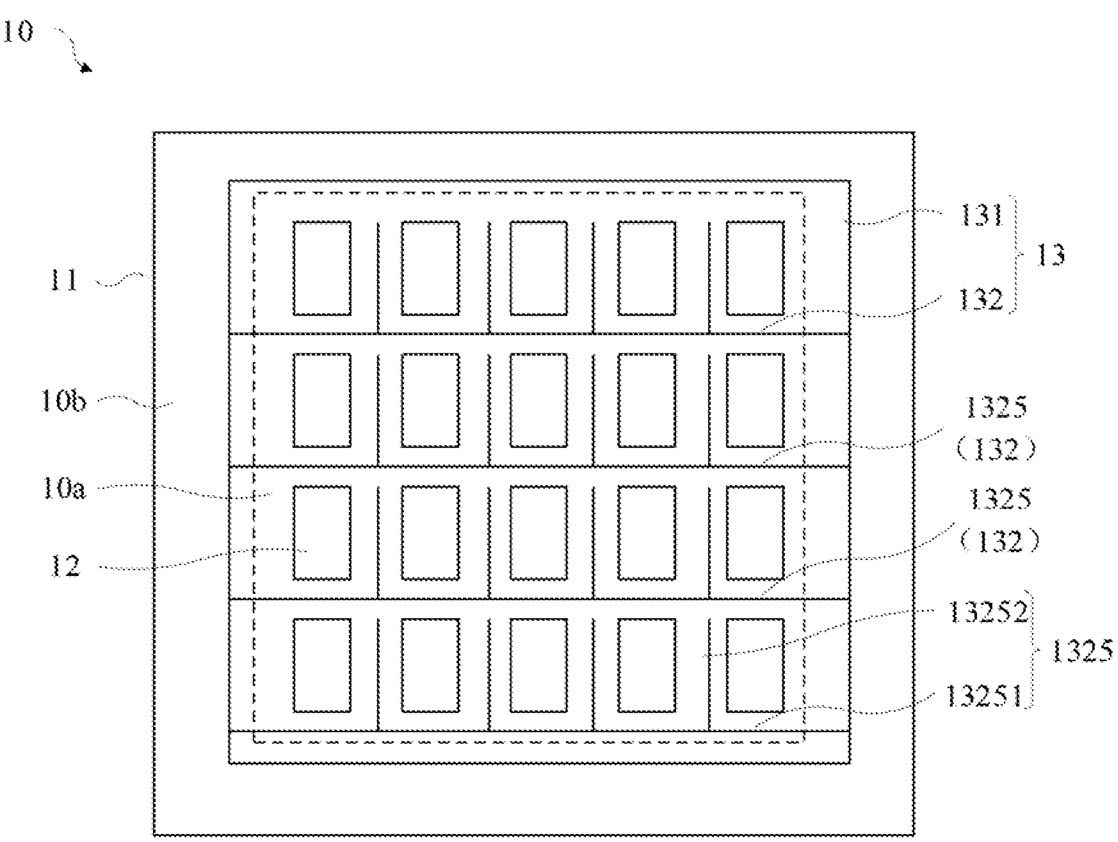
FIG. 1 illustrates a schematic diagram of a motherboard consistent with various embodiments of the present disclosure.

To facilitate understanding of the present disclosure, the present disclosure will be described more fully below with reference to relevant accompanying drawings. Preferred embodiments of the present disclosure are shown in the accompanying drawings. However, the present disclosure can be embodied in many different forms, not limited to the embodiments described herein. On the contrary, a purpose of providing the embodiments is to make an understanding of the present disclosure more thorough and comprehensive.

The terminology used in the embodiments of the present disclosure is merely illustrative and is not intended to limit the present disclosure. As used herein, the term “and/or” includes all combinations of one or more of the associated listed items.

In describing a positional relationship, unless specified otherwise, when an element such as a layer, film or substrate is referred to as being “on” another element, it can be directly on the other element or intervening elements may also be present. Further, when a layer is referred to as being “under” another layer, it can be directly under the other element or intervening elements may also be present. It will also be understood that when a layer is referred to as being “between” two layers, it can be an only layer between the two layers, or intervening elements may also be present.

In the case of using “including”, “having”, and “comprising” described herein, unless specific limited words such as “only”, “consisting of” etc. are used, otherwise another part can be added. Unless mentioned otherwise, terms of a singular form may include a plural form and shall not be construed as one in number.

Although terms "first", "second", etc. may be used herein to describe various elements, these elements should not be limited by the terms. The terms are only configured to distinguish one element from another element. For example, a first element could be termed a second element, and, similarly, a second element could be termed a first element, without departing from the scope of the present disclosure.

It should also be understood that an element, when explained but not expressly described, is interpreted to include an error range. The error range should be within an acceptable deviation range from specified values, as determined by a person skilled in the art. For example, "about", "approximately" or "substantially" can mean within one or more standard deviations, which is not limited herein.

An OLED display panel has many advantages including full solid state, active light emission, fast response speed, high contrast, no viewing angle limitation, and flexible display, and is widely used. Vapor deposition technology is a process method used in forming organic thin films for OLED display panels. The vapor deposition technology has advantages of fast deposition speed and good film formation uniformity. Specifically, in a vapor deposition process, a metal mask is usually required, and static electricity is likely to be generated when the metal mask is in contact with or separated from the motherboard. Due to a poor electrostatic protection ability of the motherboard, static electricity is easy to damage cells (display units) on the motherboard, thereby reducing product forming yield.

To solve the above problems, an electrostatic protection capability can be improved by arranging a double-layer electrostatic protection line on the substrate.

Specifically, a method of forming a motherboard and display base units is provided in one embodiment. The protection line includes an inner line and an outer line is arranged on the substrate. The inner line is arranged in the first area, and the outer line is arranged in the second area around an outer perimeter of the first area. For the display base units, the outer line is equivalent to a first layer of the electrostatic protection, and the inner line is equivalent to a second layer of electrostatic protection. The protection line provides double-layer electrostatic protection for the display base units in the first area, thereby improving electrostatic protection capability of the mother board, and further improving product forming yield.

The above is a core idea of the present disclosure, and the technical solutions in the embodiments of the present disclosure will be clearly and completely described below in conjunction with the accompanying drawings in the embodiments of the present disclosure. Based on the embodiments of the present disclosure, all other embodiments obtained by a person skilled in the art without making creative efforts belong to the protection scope of the present disclosure. It will be apparent to a person skilled in the art that various modifications and changes can be made in the present disclosure without departing from the spirit or scope of the present disclosure. Therefore, the present disclosure intends to cover the modifications and changes falling within the scope of the corresponding claims (technical solutions to be protected) and their equivalents. It should be noted that implementations provided in the embodiments of the present disclosure may be combined with each other without contradiction.

Referring to FIG. 1, a motherboard 10 is provided in one embodiment. The motherboard 10 has a first area 10*a* and a second area 10*b* surrounding the first area 10*a*. The first area 10*a* may be a central area, and the second area 10*b* may be an edge area.

Specifically, the motherboard 10 includes a substrate 11, a plurality of display base units 12, and a protection line 13. The protection line 13 and the plurality of display base units 12 are all arranged on the substrate 11. Further, the protection line 13 and the plurality of display base units 12 are all arranged on a same side of the substrate 11.

It can be understood that the substrate 11 can be a rigid substrate 11 or a flexible substrate 11. The rigid substrate 11 may be a glass substrate, a silicon substrate or the like. The flexible substrate 11 may be a polyimide (PI) substrate, a polyethylene terephthalate (PET) substrate or a polymethyl methacrylate (PMMA) substrate.

It should be noted that the display base units 12 are equivalent to display units (cells) known to a person skilled in the art, and the display base units 12 may be final products including light-emitting elements, or intermediate products that do not include light-emitting elements, which is not limited herein. It can be understood that the final products of the display base units 12 may be organic light emitting diodes (OLED), quantum dot emitting diodes (QLED), liquid crystal displays (LCD), mini light emitting diodes (Mini LED) or micro light emitting diodes (Micro LED).

Further, the plurality of display base units 12 are arranged at intervals in the first area 10*a* of the substrate 11. The protection line 13 includes an outer line 131 and an inner line 132. The outer line 131 are in the second area 10*b* around an outer periphery of the first area 10*a*. The inner line 132 is in the first area 10*a*.

It should be noted that both the outer line 131 and the inner line 132 are lines made of conductive materials. In a preferred embodiment, both the outer line 131 and the inner line 132 are metal lines.

In one embodiment, in the motherboard 10, the protection line 13 includes the inner line 132 and the outer line 131 arranged on the substrate 11. The inner line 132 is arranged in the first area 10*a*, and the outer line 131 is arranged in the second area 10*b*. The outer line 131 is also arranged around the outer periphery of the first area 10*a*. For the display base units 12, the outer line 131 is equivalent to a first layer of electrostatic protection, and the inner line 132 is equivalent to a second layer of electrostatic protection. Therefore, the protection line 13 provides double-layer electrostatic protection for the display base units 12 in the first area 10*a*, thereby improving the electrostatic protection capability of the motherboard 10, and further improving product forming yield.

It should be noted that the protection line 13 provided in the embodiment of the present disclosure can shield static electricity in the following two ways when performing electrostatic protection.

In a first way, the protection line 13 is connected to a fixed potential (such as a ground potential). When a static electricity is generated, the protection line 13 conducts the static electricity on the substrate 11, thereby dissipating the static electricity and serving as a static electricity protection.

In a second way, the protection line 13 is configured to balance consumption of static electricity. Further, the protection line 13 has a sufficient area or length. When a static electricity in a certain place is large, the static electricity can be balanced throughout an entire area of the protection line 13, achieving static electricity dissipation and thereby providing static electricity protection.

In one embodiment, referring to FIGS. 1-7, the inner line 132 is electrically connected to the outer line 131.

It should be noted that electrically connecting the inner line 132 to the outer line 131 has at least the following beneficial effects. On the one hand, when one of the inner line 132 and the outer line 131 is connected to a fixed potential (grounded), by electrically connecting the inner line 132 to the outer line 131, the other of the inner line 132 and the outer line 131 can also be grounded, which can not only reduce number of grounding lines, but also facilitate a conduction of static electricity on the inner line 132 and the outer line 131, thereby achieving a better electrostatic protection effect. On the other hand, when the inner line 132 and the outer line 131 are not connected to a fixed potential (grounded), by electrically connecting the inner line 132 to the outer line 131, a total area or total length of the protection line 13 can be increased, which is conducive to further balancing a consumption of static electricity.

It can be understood that the inner line 132 and the outer line 131 can also be electrically insulated, that is, the inner line 132 are not connected to the outer line 131. An arranging manner of the inner line 132 and the outer line 131 is not limited herein.

In one embodiment, as shown in FIGS. 1-7, the inner line 132 is arranged between any two adjacent display base units 12. That is, the electrostatic protection line 13 is provided between any two adjacent display base units 12.

Therefore, a static electricity between any two adjacent display base units 12 can be discharged or dissipated, improving a protection effect of the display base units 12.

Referring to FIG. 1, it can be understood that since the outer periphery of the first area 10 *a* is arranged with the outer line 131, at a same time, any two adjacent display base units 12 are arranged with the inner line 132, which is equivalent to that an outer periphery of each display base unit 12 is arranged with the electrostatic protection line 13, thereby improving a protection effect on the display base units 12.

Figure 2:
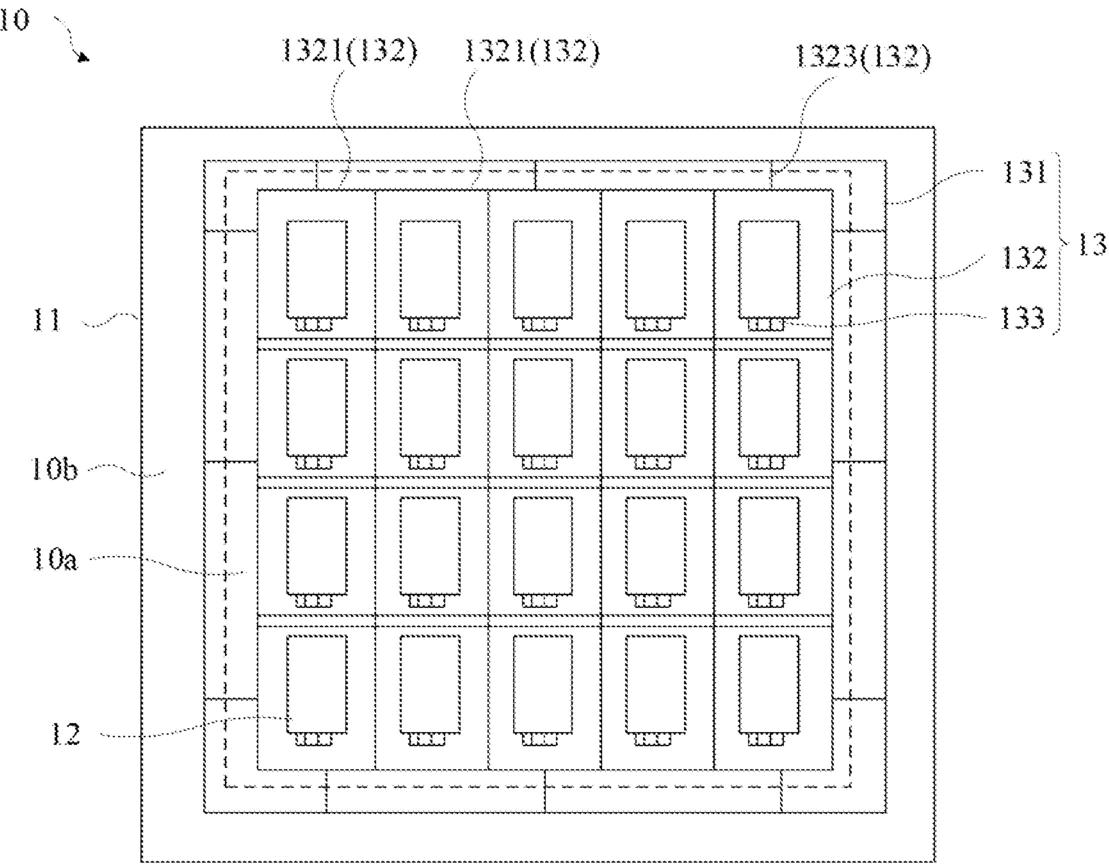
FIG. 2 illustrates a schematic diagram of another motherboard consistent with various embodiments of the present disclosure.

In one embodiment, referring to FIG. 2, the protection line 13 further includes a plurality of protective connection lines 133 electrically connected to the display base units 12, so that a static electricity on the display base units 12 is conducted to the protective connection lines 133 to achieve static electricity protection for the display base units 12.

In one embodiment, each display base unit 12 is correspondingly arranged with a protective connection lines 133.

In one embodiment, the protective connection lines 133 are electrically connected to connection pads on the display base unit 12. It can be understood that the connection pads are also connected to signal lines of the display base units 12, so that a static electricity on the signal lines and the connection pads can be conducted to the protective connection lines 133 to achieve static protection for the display base unit 12.

In one embodiment, a material of a protective connection line 133 may be polysilicon so that a resistance of the protective connection line 133 can be increased, to balance an amount of consumed charge or accelerate a charge dissipation rate.

Figure 3:
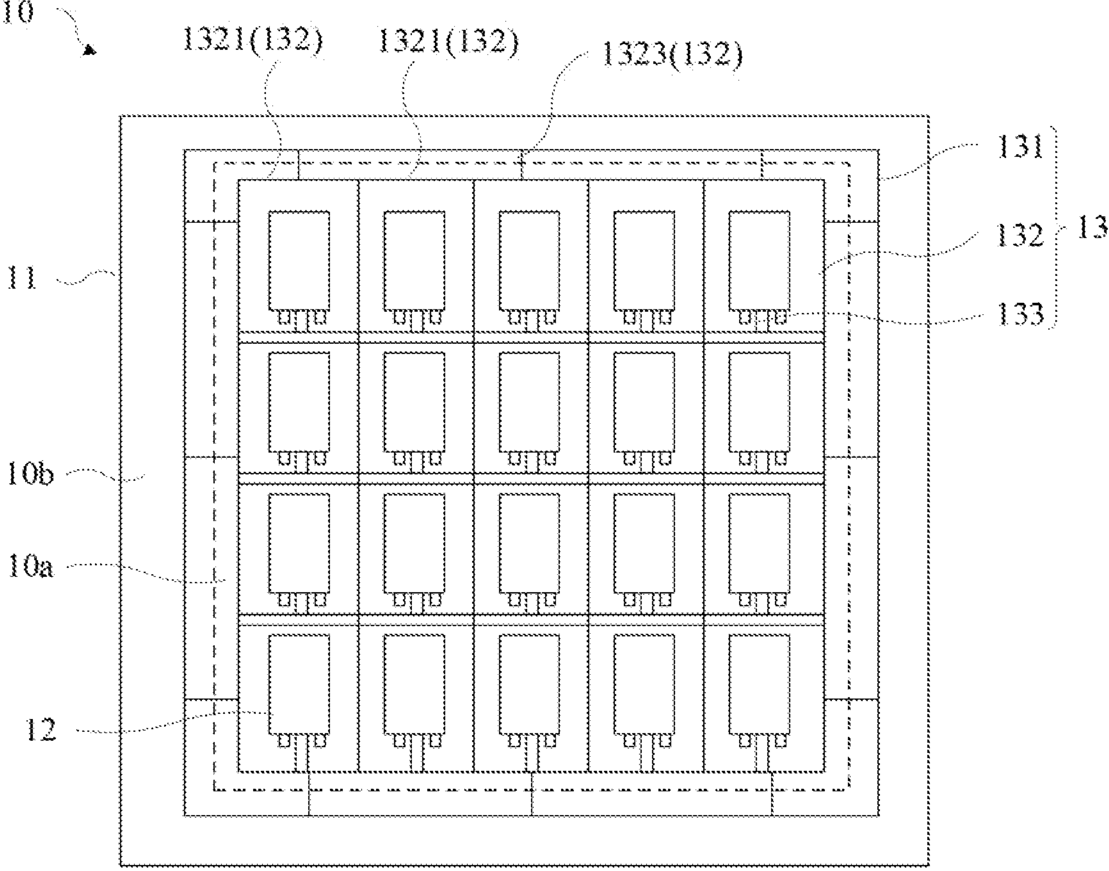
FIG. 3 illustrates a schematic diagram of another motherboard consistent with various embodiments of the present disclosure.

In one embodiment, referring to FIG. 3, the protective connection lines 133 are electrically connected to the inner line 132. Therefore, on the one hand, the protective connection lines 133 can facilitate a conduction of static electricity on the display base units 12 to the inner line 132 and the outer line 131, further balancing an amount of consumed charge, and achieving static electricity protection for the display base units 12. Alternatively, the protective connection lines 133 can speed up a charge dissipation speed, the static electricity on the display base units 12 is conducted to a fixed potential through the protection line 13, thereby releasing the static electricity, to achieve static electricity protection for the display base units 12.

In one embodiment, referring to FIG. 2 and FIG. 3, the inner line 132 includes a plurality of protective rings 1321 correspondingly arranged on outer peripheries of the plurality of display base units 12, which is equivalent to making the plurality of protective rings 1321 protect corresponding display base units 12, thereby improving an electrostatic protection effect.

In one embodiment, one protective ring 1321 corresponds to protect a plurality of display base units 12. That is, one protective ring 1321 is arranged around peripheries of a plurality of display base units 12, thereby reducing number of protective rings 1321 and reducing difficulty and cost of the protection line 13.

In one embodiment, one protective ring 1321 corresponds to protect one display base unit 12. That is, one protective ring 1321 is correspondingly arranged around a periphery of one display base unit 12. Therefore, an outer periphery of each display base unit 12 is arranged with a protection line 13, thereby improving an electrostatic protection effect of the protection line 13.

It can be understood that a shape of the protective ring 1321 may be a rectangular ring, a circular ring or any other shape, which is not limited herein.

In one embodiment, two adjacent protective rings 1321 share a same ring edge.

It should be noted that the "ring edges" refer to edges used to form the protective ring 1321. Taking a rectangular annular protective ring 1321 as an example, the rectangular annular protective ring 1321 has four edges forming an annual shape. By having two adjacent protective rings 1321 share a same ring edge, a forming cost of the protection line 13 can be reduced.

Referring to FIG. 2, in one embodiment, the following manner may be adopted for sharing a ring edge: two adjacent protective rings 1321 in a row direction share a same ring edge, while two adjacent protective rings 1321 in a column direction do not share a same ring edge.

In one embodiment, the following manner may be adopted for sharing a ring edge: two adjacent protective rings 1321 in the column direction share a same ring edge, while two adjacent protective rings 1321 in a row direction share a same ring edge.

Figure 4:
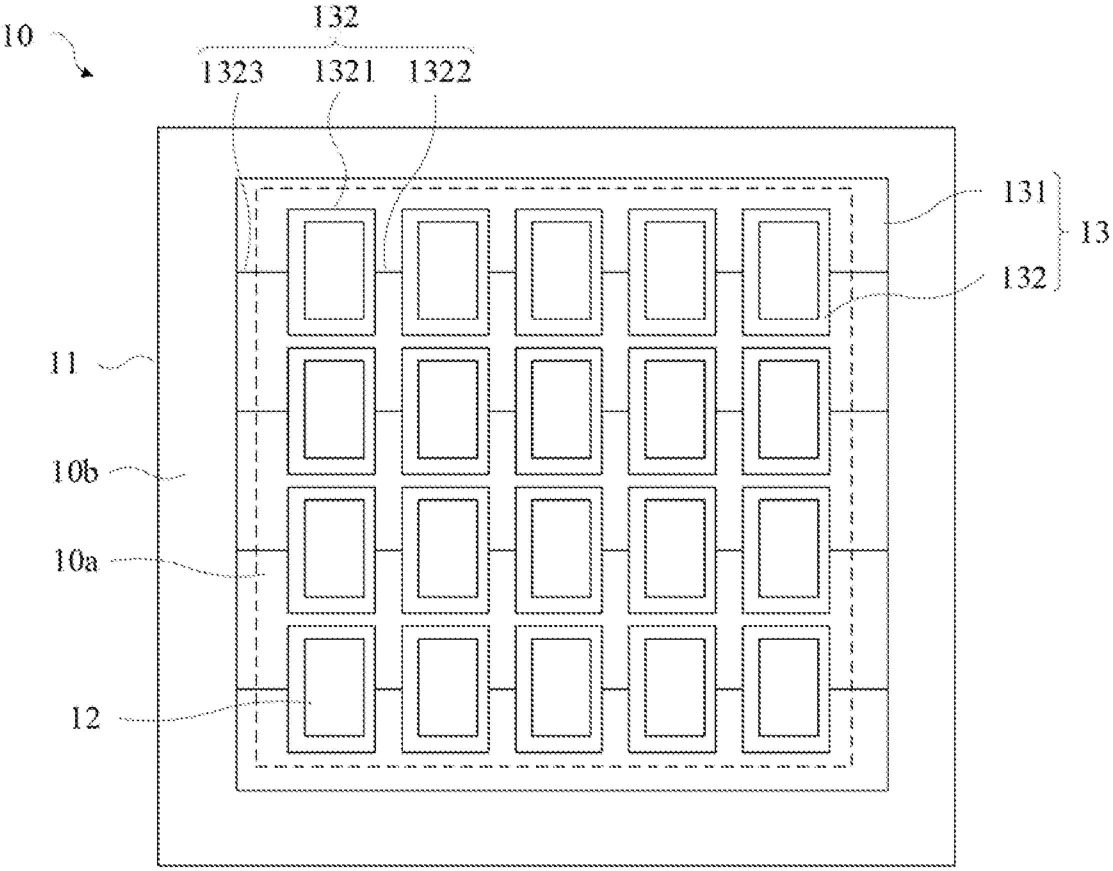
FIG. 4 illustrates a schematic diagram of another motherboard consistent with various embodiments of the present disclosure.

In one embodiment, referring to FIG. 4, the plurality of protective rings 1321 are arranged on the substrate 11 at intervals. That is, two adjacent protective rings 1321 do not share a ring edge. The inner line 132 also includes first connection lines 1322 for connecting two adjacent protective rings 1321. The protection line 13 may further include second connection lines 1323 for connecting the protective rings 1321 and the outer line 131.

By arranging the first connection line 1322 and the second connection line 1323, two adjacent protective rings 1321 can be electrically connected, and the protective rings 1321 can be electrically connected to the outer line 131. On the one hand, when one of the inner line 132 and the outer line 131 is connected to fixed potentials, by electrically connecting the inner line 132 to the outer line 131, the other of the inner line 132 and the outer line 131 can also be grounded, which can not only reduce number of grounding lines, but also facilitate a conduction of static electricity on the inner line 132 and the outer line 131, thereby achieving a better electrostatic protection effect. On the other hand, when the inner line 132 and the outer line 131 are not connected to a fixed potential, by electrically connecting the inner line 132 to the outer line 131, an area or length of the static protection line 13 can be increased, which is conducive to further balancing a consumption of static electricity.

In one embodiment, among the protective rings 1321 in a same row, two adjacent protective rings 1321 are electrically connected through a first connection line 1322. Among the protective rings 1321 in a same column, two adjacent protective rings 1321 are not connected.

In one embodiment, among the protective rings 1321 in a same column, two adjacent protective rings 1321 are electrically connected through a first connection line 1322. Among the protective rings 1321 in a same row, two adjacent protective rings 1321 are not connected.

In one embodiment, among the protective rings 1321 in a same row, two adjacent protective rings 1321 are electrically connected through a first connection line 1322. Among the protective rings 1321 in a same column, two adjacent protective rings 1321 are electrically connected through a first connection line 1322.

A connection method of the protective rings 1321 is not limited herein.

It should also be noted that, referring to FIG. 2 and FIG. 3, the protection line 13 in FIG. 2 and FIG. 3 may further includes second connection lines 1323. One end of the second connection line 1323 is electrically connected to a protective ring 1321, and the other end is electrically connected to an outer line 131. It can be understood that number of the second connection lines 1323 can be one or more, which is not limited herein.

In one embodiment, as shown in FIG. 2 and FIG. 3, an inner line 132 includes a plurality of protective rings 1321, and each protective ring 1321 is correspondingly arranged on an outer periphery of each display base unit 12. The outer line 131 is configured in a ring structure, and the plurality of protective rings 1321 is electrically connected to the outer line 131.

For each display base unit 12, the outer line 131 is equivalent to the first layer of electrostatic protection, and the protective rings 1321 are equivalent to the second layer of electrostatic protection. The protection line 13 provides a double-layer electrostatic protection for each display base unit 12 in the first area 10*a*, thereby improving an electrostatic protection capability of the motherboard 10, and further improving product forming yield.

In one embodiment, the inner line 132 may include common protective rings surrounding all base units 12. The common protective rings can be electrically connected to the outer line 131.

Figure 5:
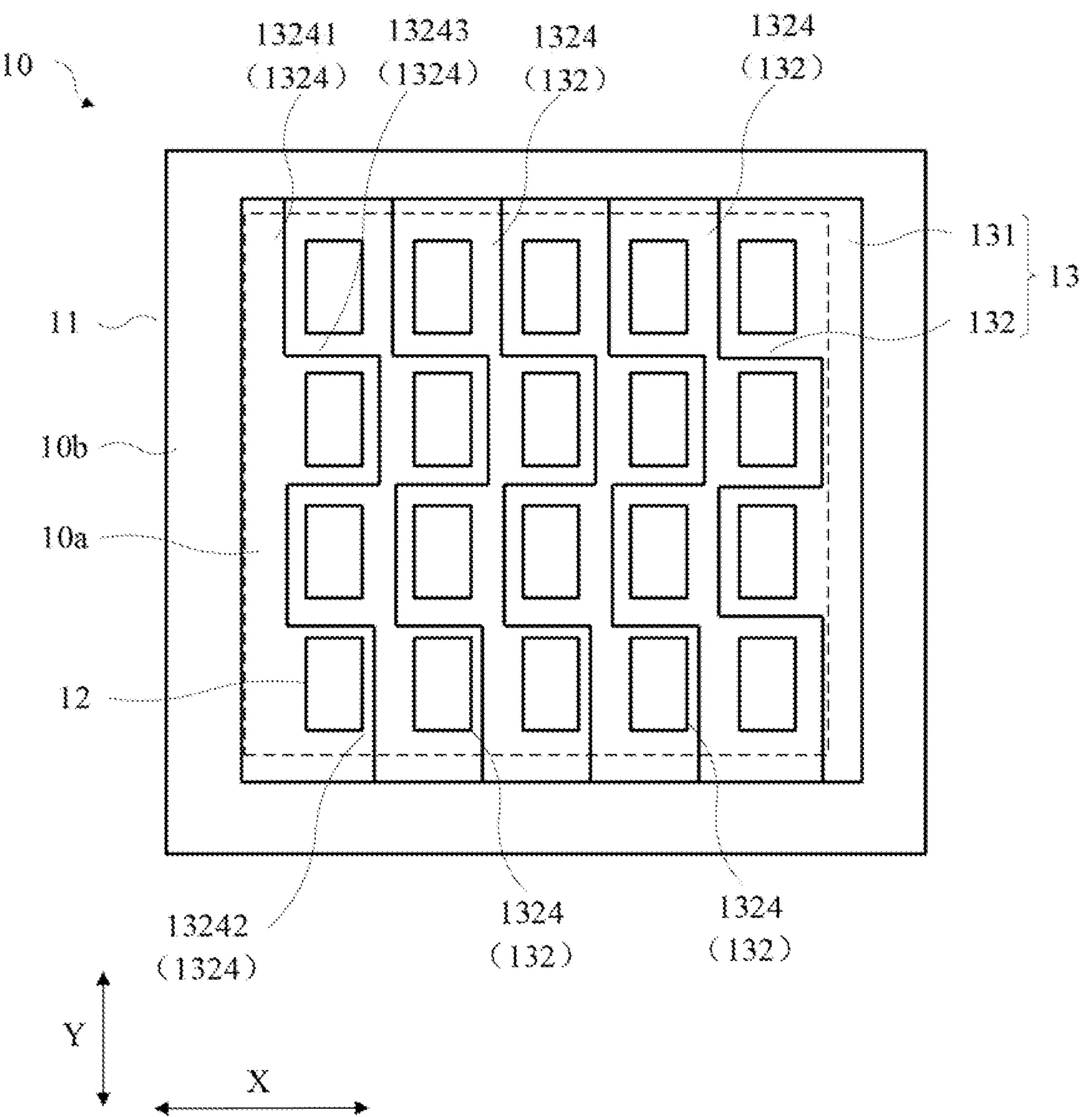
FIG. 5 illustrates a schematic diagram of another motherboard consistent with various embodiments of the present disclosure.

In one embodiment, as shown in FIG. 5, the inner line 132 includes a plurality of first sub-protection lines 1324, and a first sub-protection line 1324 includes a plurality of first branch lines 13241, a plurality of second branch lines 13242 and a plurality of third branch lines 13243.

In one example, the plurality of first sub-protection lines 1324 are arranged at intervals along a row direction. Each first sub-protection line 1324 is arranged corresponding to each column of display base units 12. In a same first sub-protection line 1324. The plurality of first branch lines 13241 are respectively located on one side of odd-numbered rows of display base units 12 of a column display base unit 12 along the first direction X, the plurality of second branch lines 13242 are respectively located on the other side of the even-number rows of display base units 12 of the column of display base units 12 along the first direction X and the plurality of third branch lines 13243 are respectively located between adjacent display base units 12 of the column of display base units 12 and are correspondingly connected to the first branch lines 13241 and the second branch lines 13242. The first direction X is parallel to the row direction.

Referring to FIG. 5, a shape of a first sub-protection line 1324 is equivalent to a polyline shape. In one embodiment, two ends of a same first sub-protection line 1324 may be electrically connected to the outer line 131 respectively. It can be understood that, in one embodiment, not only can an outer periphery of each display base unit 12 be arranged with the protection line 13, but also a total length of the protection line 13 can be reduced, thereby reducing forming costs.

In one embodiment, the plurality of first sub-protection lines 1324 are arranged at intervals along a column direction. Each first sub-protection line 1324 is arranged corresponding to each row of display base units 12. In a same first sub-protection line 1324, the plurality of first branch lines 13241 are respectively located on one side of odd-numbered columns of display base units 12 of a row of display base units 12 of the along the second direction Y, the plurality of second branch lines 13242 are respectively located on the other side even-numbered columns of display base units 12 of the row of display base units 12 of the along the second direction Y, and the plurality of third branch lines 13243 are respectively located between adjacent display base units 12 of the row of display base units 12, and are correspondingly connected to the first branch lines 13241 and the second branch lines 13242. The second direction Y is parallel to the column direction.

In the above two embodiments, two ends of a same first sub-protection line 1324 are electrically connected to the outer line 131 respectively. It can be understood that, in the embodiments, not only can an outer periphery of each display base unit 12 be arranged with the protection line 13, but also a total length of the protection line 13 can be reduced, thereby reducing forming costs.

Figure 6:
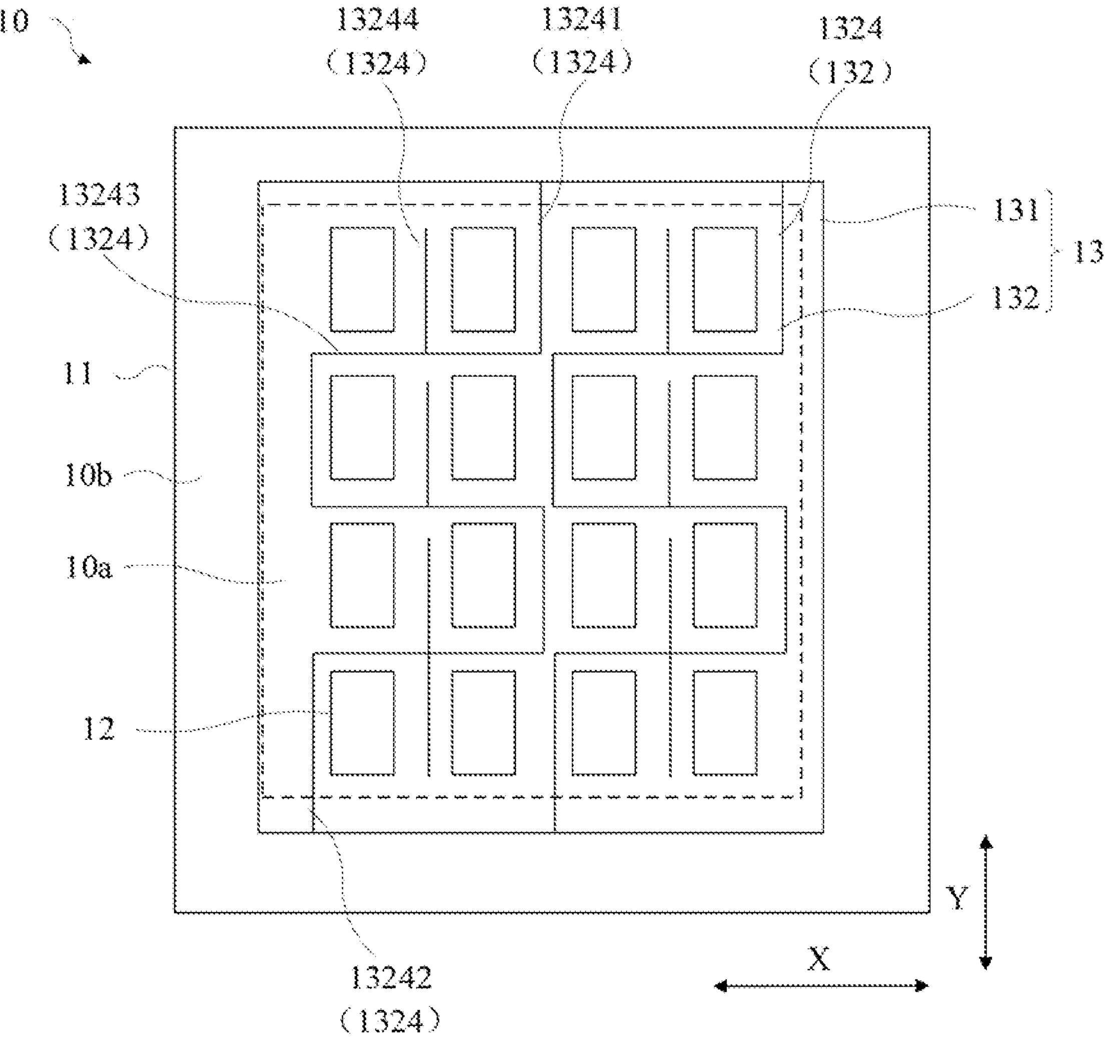
FIG. 6 illustrates a schematic diagram of another motherboard consistent with various embodiments of the present disclosure.

In one embodiment, as shown in FIG. 6, the plurality of first sub-protection lines 1324 are arranged at intervals along the row direction, and one first sub-protection line 1324 is arranged corresponding to two columns of display base units 12. Each first sub-protection line 1324 includes a plurality of first branch lines 13241, a plurality of second branch lines 13242, a plurality of third branch lines 13243 and a plurality of fourth branch lines 13244.

In a same first sub-protection line 1324, the plurality of first branch lines 13241 is respectively located on one side of odd-numbered rows of display base units 12 of two columns of display base units 12 along the first direction X, the plurality of second branch lines 13242 is respectively located on the other side of even-numbered rows of display base units 12 of two columns of display base units 12 along the first direction X, and the plurality of third branch lines 13243 are respectively located between adjacent display base units 12 in the two columns of display base units 12 in the column direction. Each third branch line 13243 is correspondingly connected to a first branch line 13241 and a second branch line 13242. The fourth branch lines 13244 are arranged between adjacent display base units 12 in the two columns of display base units 12 in the row direction. The fourth branch lines 13244 are connected to the third branch lines 13243.

In the embodiment, two ends of a same first sub-protection line 1324 are electrically connected to the outer line 131 respectively. It can be understood that, with the above arrangement, not only can an outer periphery of each display base unit 12 be arranged with the protection line 13, but also can reduce a total length of the protection line 13, thereby reducing forming costs.

In one embodiment, as shown in FIG. 1, the inner line 132 includes a plurality of second sub-protection lines 1325, and a second sub-protection line 1325 includes a main line 13251 and a plurality of auxiliary lines 13252 connected to the main line 13251.

In one embodiment, a plurality of second sub-protection lines 1325 are arranged at intervals along the column direction, and each second sub-protection line 1325 is arranged corresponding to each row of display base units 12. Main lines 13251 of each second sub-protection line 1325 are respectively located between two adjacent row display base units 12. In a same second sub-protection line 1325, the plurality of sub-lines 13252 are respectively located between adjacent display base units 12 of a row of display base units 12.

In the embodiment, two ends of a same second sub-protection line 1325 are electrically connected to the outer line 131 respectively, that is, two ends of the main line 13251 are electrically connected to the outer line 131 respectively. It can be understood that, in the embodiment, not only can an outer periphery of each display base unit 12 be arranged with the protection line 13, but also a total length of the protection line 13 can be reduced, thereby reducing forming costs.

In one embodiment, the plurality of second sub-protection lines 1325 are arranged at intervals along a row direction, and each second sub-protection line 1325 is arranged corresponding to each column of display base units 12. Main lines 13251 of each second sub-protection line 1325 are respectively located between two adjacent display base units 12 of a column of display units 12. In a same second sub-protection line 1325, the plurality of sub-lines 13252 are between adjacent display base units 12 of the column of display base units 12.

In the embodiment, two ends of a same second sub-protection line 1325 are electrically connected to the outer line 131 respectively, that is, two ends of the main line 13251 are electrically connected to the outer line 131 respectively. It can be understood that, in the embodiment, not only can an outer periphery of each display base unit 12 be arranged with the protection line 13, but also a total length of the protection line 13 can be reduced, thereby reducing forming costs.

Figure 7:
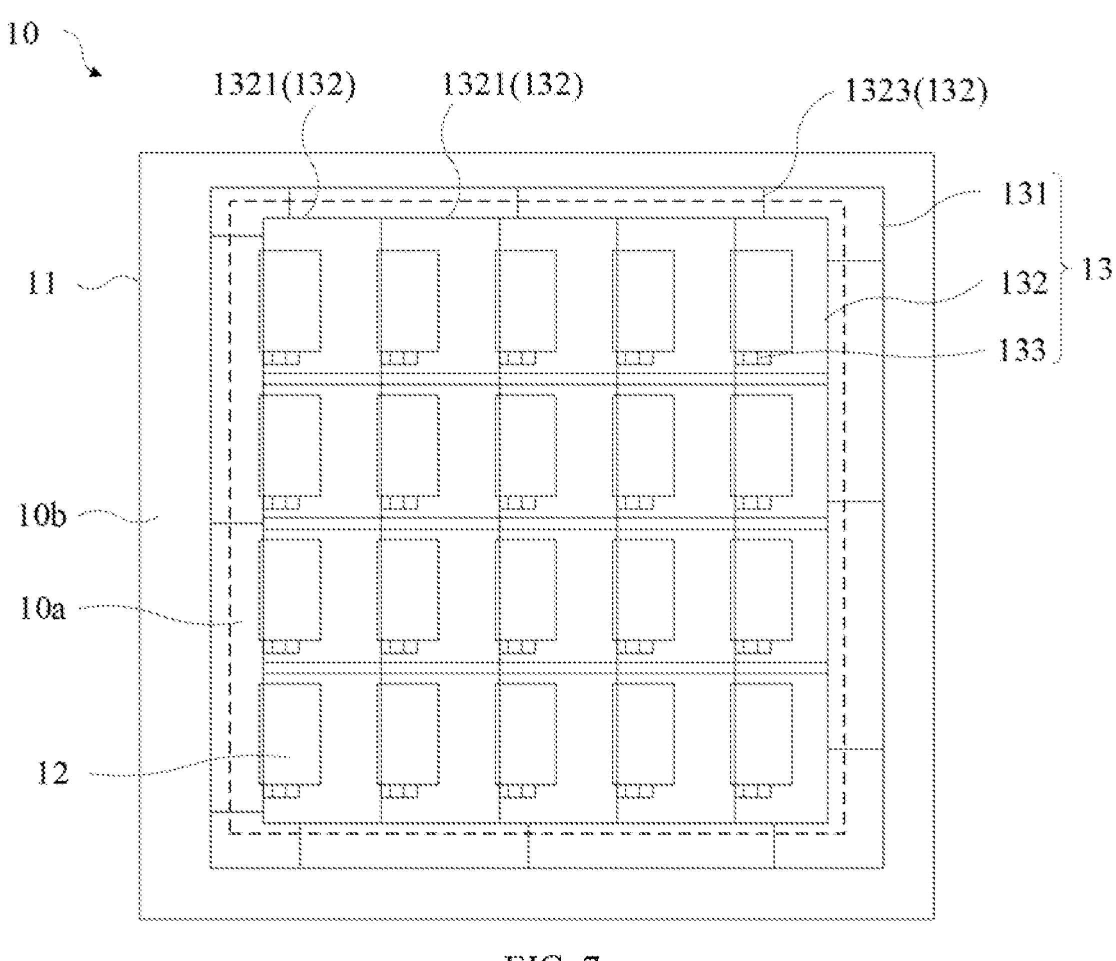
FIG. 7 illustrates a schematic diagram of another motherboard consistent with various embodiments of the present disclosure.
Figure 8:
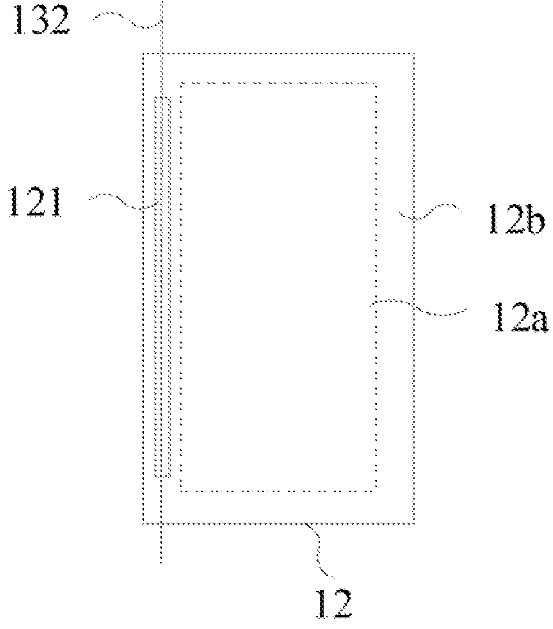
FIG. 8 illustrates a local schematic diagram of display base units and an inner line shown in FIG. 7.

In one embodiment, as shown in FIG. 7 and FIG. 8, a display base unit 12 has an active area 12 *a* and a cutting area 12 *b* surrounding the active area 12 *a*, and an auxiliary metal layer 121 is arranged in the cutting area 12 *b*. The inner line 132 overlaps the auxiliary metal layer 121. Specifically, the active area 12*a* is an area where a display screen is subsequently formed, and the cutting area 12*b* is an area that is discarded after being cut.

It should be noted that the auxiliary metal layer 121 may be a cutting mark (Mark) made of metal. An overlapping of the protection line 13 and the auxiliary metal layer 121 means that an orthographic projection of the protection line 13 on the substrate 11 overlap an orthographic projection of the auxiliary metal layer 121 on the substrate 11, or in the thickness direction of the substrate 11, the protection line 13 overlap the auxiliary metal layer 121. By overlapping the inner line 132 with the auxiliary metal layer 121, the inner line 132 and the auxiliary metal layer 121 can form a capacitive structure (the protection line 13 and the auxiliary metal layer 121 are insulated and overlapped). When static electricity is generated on the display base unit 12, capacitors can store electrostatic charges, to achieve electrostatic charge dilution on the display base units 12, thereby reducing damages of the electrostatic charges to the display base units 12.

Figure 9:
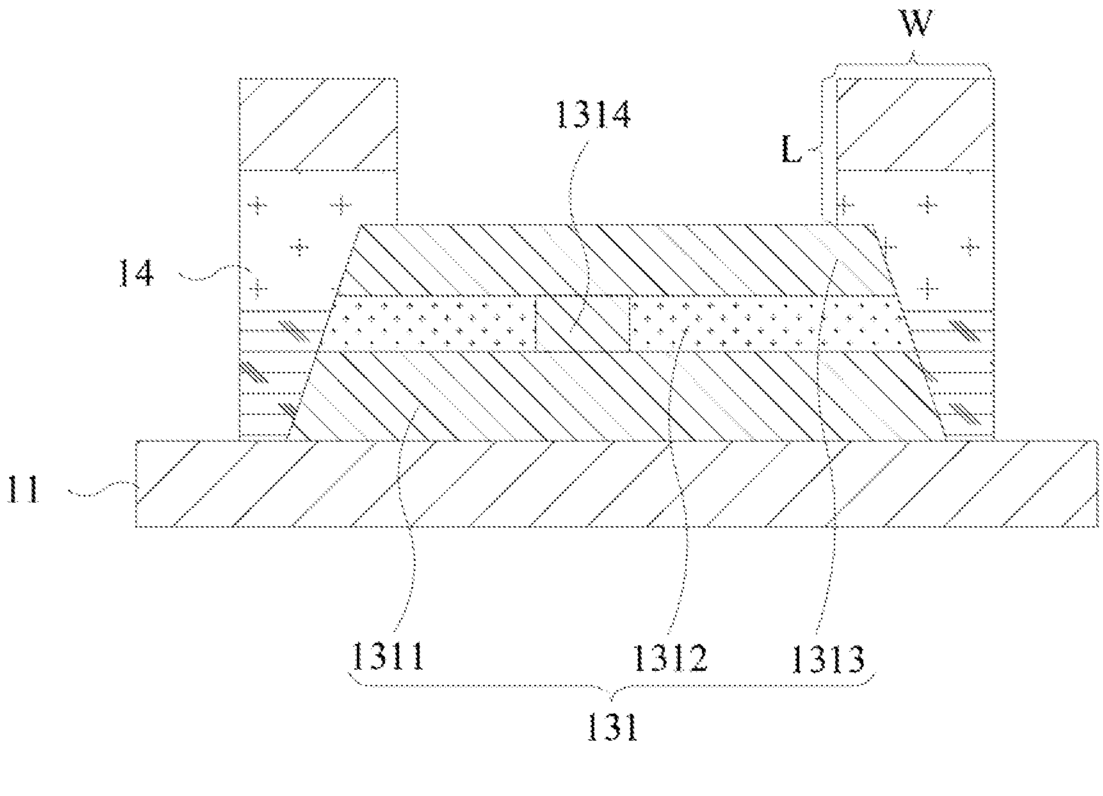
FIG. 9 illustrates a cross-sectional view of an outer line consistent with various embodiments of the present disclosure.

In one embodiment, as shown in FIG. 9, at least part of a top surface of the outer line 131 is exposed.

It can be understood that, during a forming process of the motherboard 10, a manipulator of a forming device may be in contact with a top surface of the motherboard 10. By exposing at least part of the top surface of the outer line 131, it is convenient for the outer line 131 to contact with the manipulator of the forming device, to conduct a static electricity away and achieve a purpose of discharging static electricity.

In one embodiment, two sides of the outer line 131 are arranged with insulating structures 14 along a third direction A. The third direction A is perpendicular to a thickness direction of the substrate 11 and an extending direction of the outer line 131. Arranging the insulating structure 14 on two sides of the outer line 131 is equivalent to arranging wrapping edges on two sides of the outer line 131 to protect the outer line 131 and prevent sides of the outer line 131 from being exposed and damaged.

It should be noted that an insulating structure 14 may be a laminated structure. Exemplarily, the insulating structure 14 may be composed of at least one film layer among a planarization layer, a pixel defining layer, an insulating layer, and a protection layer.

In one embodiment, the outer line 131 is a ring structure. Arranging the outer line 131 as a ring structure is conducive to improving an electrostatic protection capability of the outer line 131.

In one embodiment, the outer line 131 are shaped like closed rings, such as closed ellipses, circles, polygons, or any other shapes known to a person skilled in the art. A polygon can be a triangle, a quadrangle, a pentagon, or the like. In the embodiment, a closed shape of the outer line 131 being a quadrangle is taken as an example for illustration, which is not limited herein. In other embodiments, the outer line 131 may also be in open shapes.

In one embodiment, an outer line 131 includes a first metal layer 1311, a first insulating layer 1312, and a second metal layer 1313 that are stacked. The first insulating layer 1312 is arranged with a first conductive column 1314, and the first metal layer 1311 and the second metal layer 1313 are electrically connected through the first conductive column 1314. Arranging the first metal layer 1311 and the second metal layer 1313 to be electrically connected is conducive to reducing resistances of the outer line 131 to facilitate a conduction of static electricity.

It should be noted that an outer line 131 may also include other metal layers and insulating layers. For example, the outer line 131 further include a second insulating layer (not shown) and a third metal layer (not shown). The second insulating layer is arranged on the second metal layer 1313, the third metal layer is arranged on the second insulating layer, the second insulating layer is arranged with a second conductive column (not shown). The second metal layer 1313 and the third metal layer are also connected through the second conductive column.

It can be understood that the substrate 11 is arranged with scanning lines, data lines, pixel electrodes, or the like. The first metal layer 1311 and the second metal layer 1313 of the outer line 131 can be arranged on a same layer as the scanning lines, data lines or pixel electrodes, that is, formed in same process steps, thereby reducing process steps and reducing forming costs.

It can be understood that an inner line 132 may also include a plurality of metal layers. Further, the plurality of metal layers of the inner line 132 can also be arranged on a same layer as scan lines, data lines or pixel electrodes. A specific structure of the inner line 132 is not limited herein.

In one embodiment, a width of the outer line 131 is between 1000-1500 μm. Specifically, the width of the outer line 131 is a dimension of an orthographic projection of the outer line 131 on the substrate 11 in a direction perpendicular to an extending direction of the outer line 131. Exemplarily, the width of the outer line 131 may be 1000 μm, 1100 μm, 1150 μm, 1200 μm, 1255 μm, 1300 μm, 1360 μm, 1400 μm, 1480 μm or 1500 μm.

By making the width of the outer line 131 within the above range, a resistance of the outer line 131 can be reduced under a premise of satisfying a forming process, so that the outer line 131 can conduct static electricity.

In one embodiment, the inner line 132 has a width of 30-50 μm. Specifically, the width of the inner line 132 is a dimension of an orthographic projection of the inner line 132 on the substrate 11 in the direction perpendicular to the extending direction of the inner line 132. Exemplarily, the width of the inner line 132 may be 30 μm, 35 μm, 40 μm, 45 μm, 48 μm, or 50 μm.

By making the width of the inner line 132 within the above range, a resistance of the inner line 132 can be reduced without affecting forming of a display base unit 12, thereby facilitating a conduction of static electricity on the inner line 132.

In one embodiment, as shown in FIG. 9, a width W of an insulating structure 14 is between 3 μm-10 μm. Exemplarily, the width W of the insulating structure 14 may be 3 μm, 4 μm, 5 μm, 6 μm, 7 μm, 8 μm, 9 μm or 10 μm. By arranging the width W of the insulating structure 14 within the above range, a forming cost can be reduced while ensuring a protection strength of the insulating structure 14.

In one embodiment, as shown in FIG. 9, a distance L between a top surface of the insulating structure 14 and a top surface of the outer line 131 is 1.5 μm-5 μm. Exemplarily, the distance L may be 1.5 μm, 2 μm, 2.5 μm, 2.7 μm, 3 μm, 3.5 μm, 4 μm or 5 μm. By making the distance L between the top surface of the insulating structure 14 and the top surface of the outer line 131 be in the above range, on the one hand the top surface of the outer line 131 can be protected. On the other hand, when a manipulator of a forming device is on a top surface of the insulating structure 14, the static electricity on the outer line 131 may undergo a transition and conduct to the manipulator to realize a discharge of static electricity.

It should be noted that numerical values and numerical ranges involved in the embodiments are approximate values, and there may be a certain range of errors due to an influence of a forming process. A person skilled in the art can consider the certain range of errors to be negligible.

Figure 10:
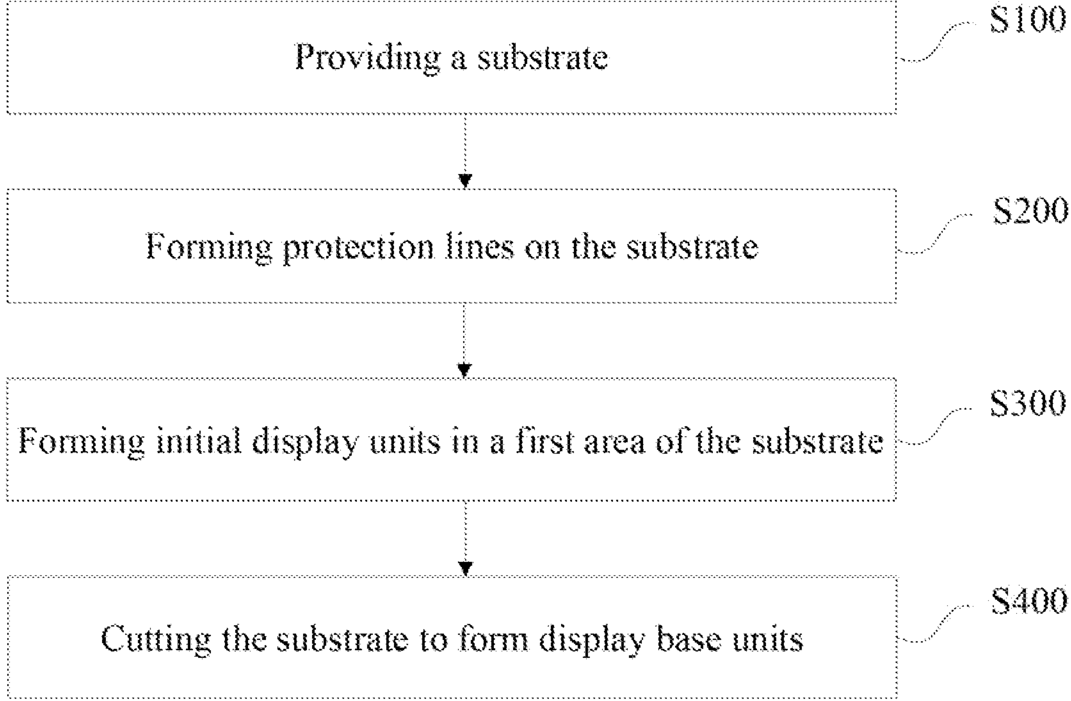
FIG. 10 illustrates a flow chart of a forming method of display base units consistent with various embodiments of the present disclosure.

Referring to FIG. 10, and in combination with FIG. 11, FIG. 12, FIG. 13, and FIG. 14, one embodiment provides a method of forming display base units 12, including following steps.

S100: providing a substrate 11.

Figure 11:
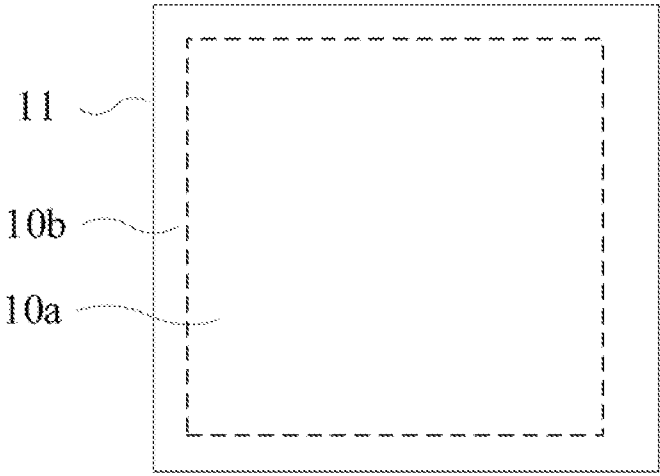
FIGS. 11-14 illustrate schematic diagrams of structures during a process of the forming method shown in FIG. 10.

Referring to FIG. 11, the substrate 11 has a first area 10*a* and a second area 10*b* surrounding the first area 10*a*. The first area 10*a* may be a central area and the second area 10*b* may be an edge area.

Specifically, the substrate 11 may be a rigid substrate or a flexible substrate. The rigid substrate may be a glass substrate, a silicon substrate 11 or the like. The flexible substrate may be a polyimide (PI) substrate, a polyethylene terephthalate (PET) substrate or a polymethyl methacrylate (PMMA) substrate. It should be noted that a selection and pretreatment of the substrate 11 are familiar to a person skilled in the art, which is not repeated herein.

S200: forming a protection line 13 on the substrate 11.

Figure 12:
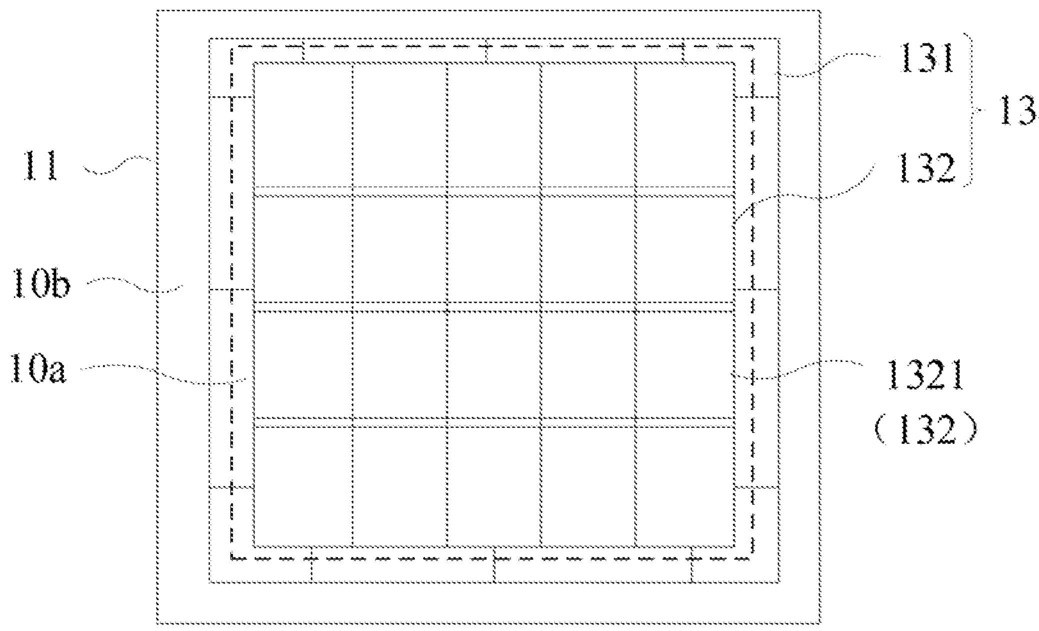
Figure 13:
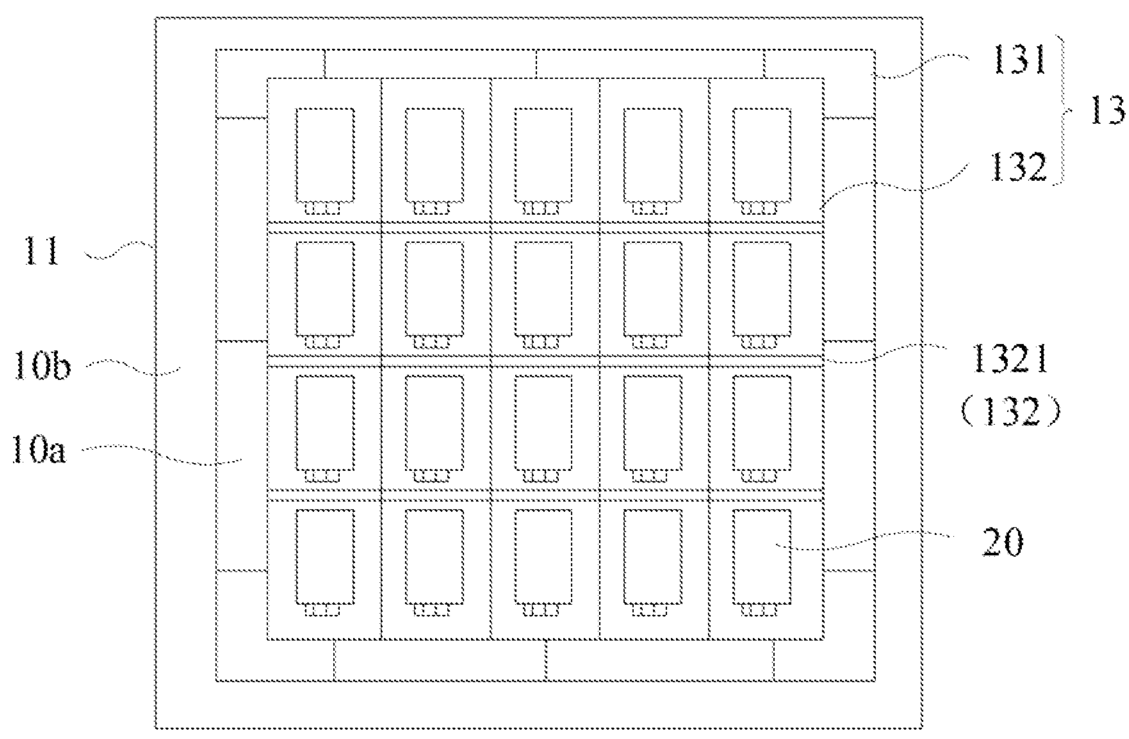
Figure 14:
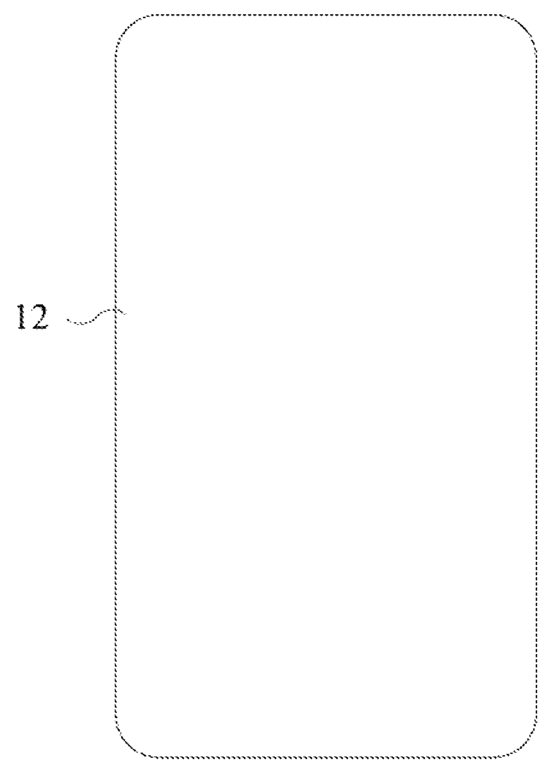

As shown in FIG. 12, the protection line 13 include an outer line 131 and an inner line 132, the outer line 131 is in the second area 10*b* around an outer periphery of the first area 10*a*. The inner line 132 is arranged in the first area 10*a*.

S300: forming initial display units 20 on the first area 10*a* of the substrate 11.

It should be noted that the initial display units 20 include a film layer array and a light emitting layer group that are stacked. The array film layer and the protection line 13 can be formed in a same step. The light emitting layer group can be formed in S300.

S400: cutting the substrate 11 to form the display base units 12.

Although various steps in a flow chart shown in FIG. 10 are displayed sequentially as indicated by the arrows, the steps are not necessarily executed sequentially in an order indicated by arrows. Unless otherwise specified, there is no strict order restriction on the execution of the steps, and the steps can be executed in any other order. At least some of the steps in FIG. 10 may include a plurality of steps or stages, the plurality of steps or stages is not necessarily performed at a same time but may be performed at different times. An execution order of the plurality of steps or stages is not necessarily sequentially but may be performed in turn or alternately with other steps or at least part of steps or stages in other steps.

As disclosed, the motherboard and the method of forming display base units provided by the present disclosure at least realize the following beneficial effects.

In the motherboard provided by the present disclosure, the protection line includes an inner line and an outer line are arranged on the substrate, the inner line is arranged in the first area, the outer line is arranged in the second area. In addition, the outer line is also arranged around the outer perimeter of the first area. For the display base units, the outer line is equivalent to the first layer of electrostatic protection, and the inner line is equivalent to the second layer of electrostatic protection. Therefore, the protection line provide double-layer electrostatic protection for the display base units in the first area, thereby improving an electrostatic protection ability of the motherboard, and improving product forming yield.

The technical features of the above embodiments can be combined arbitrarily. For a sake of concise description, possible combinations of the technical features in the above embodiments are not fully described. However, if there is no contradiction in the combination of the technical features, the technical features should be considered as within the scope of the present specification.

The above embodiments only represent some implementations of the present disclosure A description thereof is relatively specific and detailed but should not be construed as limiting the scope of the patent for the disclosure. It should be noted that a person skilled in the art can make some modifications and improvements without departing from concepts of the present disclosure, all of which fall within the protection scope of the present disclosure. Therefore, the protection scope of the present disclosure should be based on appended claims.

What is claimed is:

1. A motherboard including a first area and a second area surrounding the first area, the motherboard comprising:

a substrate;

a plurality of display base units arranged at intervals on the substrate in the first area; and a protection line on the substrate including:

an outer line in the second area and surrounding an outer periphery of the first area, an inner line in the first area, wherein a display base unit of the plurality of display base units has an active area and a cutting area surrounding the active area, and an auxiliary metal layer is arranged in the cutting area; and the inner line overlaps the auxiliary metal layer.

2. The motherboard according to claim 1, wherein the inner line is electrically connected to the outer line.

3. The motherboard according to claim 1, wherein the inner line is arranged between any two adjacent display base units.

4. The motherboard according to claim 2, wherein the protection line also includes a plurality of protective connection lines electrically connected to the plurality of display base units.

5. The motherboard according to claim 4, wherein each of the plurality of protective connection lines is electrically connected to the inner line.

6. The motherboard according to claim 1, wherein the inner line includes a plurality of protective rings correspondingly arranged on outer peripheries of the plurality of display base units.

7. The motherboard according to claim 6, wherein two adjacent protective rings share a same ring edge.

8. The motherboard according to claim 6, wherein:

the plurality of protective rings is arranged on the substrate at intervals; and the inner line also includes first connection lines and second connection lines, the first connection lines are configured to connect two adjacent protective rings, and the second connection lines are configured to connect the protective rings and the outer line.

9. The motherboard according to claim 1, wherein:

the inner line includes a plurality of first sub-protection lines, a first sub-protection line of the plurality of first sub-protection lines including a plurality of first branch lines, a plurality of second branch lines and a plurality of third branch lines; and the plurality of first sub-protection lines are arranged at intervals along a row direction, each first sub-protection line is arranged corresponding to each column of the plurality of display base units, in a same first sub-protection line, the plurality of first branch lines is respectively located on one side of odd-numbered rows of display base units in a column of display base units along a first direction, the plurality of second branch lines are respectively located on the other side of even-numbered rows of display base units in the column of display base units along the first direction, the plurality of third branch lines is respectively located between adjacent display base units of the column of display base units along the first direction and is correspondingly connected to the plurality of first branch lines and the plurality of second branch lines, and the first direction is parallel to the row direction.

10. The motherboard according to claim 1, wherein:

the inner line includes a plurality of first sub-protection lines, a first sub-protection line of the plurality of first sub-protection lines including a plurality of first branch lines, a plurality of second branch lines and a plurality of third branch lines; and the plurality of first sub-protection lines is arranged at intervals along a column direction, each first sub-protection line is arranged corresponding to each row of display base units, in a same first sub-protection line, the plurality of first branch lines is respectively on one side of odd-numbered columns of display base units in a row of display base units along a second direction, the plurality of second branch lines is respectively located on the other side of the even-numbered columns of display base units in the row of display base units along the second direction, the plurality of third branch lines is respectively located between adjacent display base units of the row of display base units, and is correspondingly connected to plurality of first branch lines and the plurality of second branch lines, and the second direction is parallel to the column direction.

11. The motherboard according to claim 1, wherein:

the inner line includes a plurality of second sub-protection lines, a second sub-protection line of the plurality of second sub-protection lines including a main line and a plurality of auxiliary lines connected to the main line; and the plurality of second sub-protection lines is arranged at intervals along a column direction, each second sub-protection line is arranged corresponding to each row of display base units, main lines of the each second sub-protection lines are respectively located between two adjacent display base units of a row of display base units, in a same second sub-protection line, the plurality of auxiliary lines is respectively located between the adjacent display base units of the row of display base units.

12. The motherboard according to claim 1, wherein:

the inner line includes a plurality of second sub-protection lines, a second sub-protection line of the plurality of second sub-protection lines including a main line and a plurality of auxiliary lines connected to the main line; and the plurality of second sub-protection lines is arranged at intervals along a row direction, and each second sub-protection line is arranged corresponding to each column of display base units, main lines of each second sub-protection line are respectively located between two adjacent display base units of a column of display base units and in a same second sub-protection line, the plurality of auxiliary lines are between adjacent display base units of the column of display base units.

13. The motherboard according to claim 1, wherein:

the inner line includes a plurality of protective rings, each protective ring is arranged correspondingly on an outer periphery of each display base unit; and the outer line is configured in a ring structure, and the plurality of protective rings is electrically connected to the outer line.

14. A motherboard including a first area and a second area surrounding the first area, the motherboard comprising:

a substrate;

a plurality of display base units arranged at intervals on the substrate in the first area; and a protection line on the substrate including:

an outer line in the second area and surrounding an outer periphery of the first area, and an inner line in the first area, wherein at least part of a top surface of the outer line is exposed.

15. The motherboard according to claim 14, wherein:

insulating structures are arranged on two sides of the outer line along a third direction; and the third direction is perpendicular to a thickness direction of the substrate and an extending direction of the outer line; and/or the outer line is configured in a ring structure.

16. The motherboard according to claim 15, wherein the outer line includes a first metal layer, a first insulating layer and a second metal layer that are stacked, the first insulating layer is arranged with a first conductive column, the first metal layer and the second metal layer are electrically connected through the first conductive column.

17. A method of forming display base units, wherein a display base unit has an active area and a cutting area surrounding the active area, and the method comprising:

providing a substrate, the substrate having a first area and a second area surrounding the first area;

forming a protection line on the substrate, the protection line including an outer line and an inner line, the outer line being in the second area around an outer periphery of the first area, and the inner line being in the first area;

forming initial display units in the first area of the substrate; and cutting the substrate to form the display base units.

* * * * *